United States Patent
Zuo et al.

(10) Patent No.: US 6,889,755 B2
(45) Date of Patent: May 10, 2005

(54) HEAT PIPE HAVING A WICK STRUCTURE CONTAINING PHASE CHANGE MATERIALS

(75) Inventors: Jon Zuo, Lancaster, PA (US); Donald M. Ernst, Lancaster, PA (US)

(73) Assignee: Thermal Corp., Stanton, DE (US)

( * ) Notice: Subject to any disclaimer, the term of this patent is extended or adjusted under 35 U.S.C. 154(b) by 102 days.

(21) Appl. No.: 10/370,349

(22) Filed: Feb. 18, 2003

(65) Prior Publication Data

US 2004/0159422 A1 Aug. 19, 2004

(51) Int. Cl.$^7$ .............................................. F28D 15/00
(52) U.S. Cl. ........................ 165/104.26; 165/104.21; 165/185; 361/700; 174/15.2; 257/714
(58) Field of Search ................ 165/104.21, 104.26, 165/104.33, 185; 361/699, 700; 174/15.2; 257/714–716

(56) References Cited

U.S. PATENT DOCUMENTS

| | | | |
|---|---|---|---|
| 3,596,713 A | * | 8/1971 | Katz ..................... 165/104.13 |
| 3,613,778 A | | 10/1971 | Feldman Jr. |
| 3,681,843 A | | 8/1972 | Arcella et al. |
| 3,786,861 A | * | 1/1974 | Eggers ................... 165/104.26 |
| 3,788,388 A | | 1/1974 | Barkmann |
| 4,046,190 A | | 9/1977 | Marcus et al. |
| 4,489,777 A | | 12/1984 | Del Bagno et al. |
| 4,616,699 A | | 10/1986 | Grote |
| 4,756,958 A | | 7/1988 | Bryant et al. |
| 4,819,719 A | | 4/1989 | Grote et al. |
| 4,830,097 A | | 5/1989 | Tanzer |
| 4,911,232 A | | 3/1990 | Colvin et al. |
| 5,007,478 A | | 4/1991 | Sengupta |
| 5,053,446 A | | 10/1991 | Salyer |
| 5,101,560 A | | 4/1992 | Leonard et al. |
| 5,224,356 A | | 7/1993 | Colvin et al. |
| 5,283,715 A | | 2/1994 | Carlsten et al. |
| 5,408,128 A | | 4/1995 | Furnival |
| 5,446,318 A | | 8/1995 | Koike et al. |
| 5,456,852 A | | 10/1995 | Isiguro |
| 5,555,932 A | | 9/1996 | Dudley |
| 5,621,615 A | | 4/1997 | Dawson et al. |
| 5,662,161 A | | 9/1997 | Hughes et al. |
| 5,767,573 A | | 6/1998 | Noda et al. |
| 5,769,154 A | | 6/1998 | Adkins et al. |
| 5,826,645 A | | 10/1998 | Meyer, IV et al. |
| 5,831,831 A | | 11/1998 | Freeland |
| 5,883,426 A | | 3/1999 | Tokuno et al. |
| 5,947,193 A | | 9/1999 | Adkins et al. |
| 5,986,884 A | | 11/1999 | Jairazbhoy et al. |
| 6,056,044 A | | 5/2000 | Benson et al. |
| 6,075,700 A | | 6/2000 | Houghton et al. |
| 6,139,783 A | | 10/2000 | McCullough |
| 6,148,906 A | | 11/2000 | Li et al. |
| 6,154,364 A | | 11/2000 | Girrens et al. |
| 6,167,948 B1 | | 1/2001 | Thomas |
| 6,227,287 B1 | | 5/2001 | Tanaka et al. |
| 6,237,223 B1 | | 5/2001 | McCullough |
| 6,310,775 B1 | | 10/2001 | Nagatomo et al. |
| 6,317,321 B1 | * | 11/2001 | Fitch et al. ................. 361/700 |
| 6,381,845 B2 | | 5/2002 | Ikeda et al. |
| 6,550,530 B1 | * | 4/2003 | Bilski ..................... 165/104.26 |
| 2002/0033247 A1 | * | 3/2002 | Neuschutz et al. ........... 165/10 |

FOREIGN PATENT DOCUMENTS

JP          3-196657          8/1991

* cited by examiner

*Primary Examiner*—Terrell McKinnon
(74) *Attorney, Agent, or Firm*—Duane Morris LLP

(57) ABSTRACT

A wick for use in a heat pipe is provided incorporating particles of micro-encapsulated phase change material bonded together to form the wick. Use of a wick structure comprising micro-encapsulated PCM particles has the advantage of providing an additional heat absorber. This greatly enhances the ability of the heat pipe to absorb excess heat and may help to prevent damage to the heat pipe or heat generating component, such as an electronic device, especially at times of peak thermal loads.

4 Claims, 3 Drawing Sheets

HEAT PIPE HAVING A WICK STRUCTURE CONTAINING PHASE CHANGE MATERIALS

FIELD OF THE INVENTION

The present invention relates to heat pipes for heat dissipation, and more particularly, to heat pipes having a wick structure comprised of micro-encapsulated phase change materials.

BACKGROUND OF THE INVENTION

Heat pipes are highly efficient devices for transferring large quantities of heat from a heat source to an area where the heat can be dissipated. A heat pipe generally consists of a vacuum tight envelope, a wick structure and a working fluid. The heat pipe is evacuated and then back-filled with a small quantity of working fluid, typically just enough to saturate the wick. The atmosphere inside the heat pipe is set by an equilibrium of liquid and vapor. As heat enters at the evaporator, this equilibrium is upset generating vapor at a slightly higher pressure. This higher pressure vapor travels to the condenser end where the slightly lower temperatures cause the vapor to condense giving up its latent heat of vaporization. The condensed fluid is then pumped back to the evaporator by the capillary forces developed in the wick structure. This continuous cycle transfers large quantities of heat with very low thermal gradients. A heat pipe's operation is passive being driven only by the heat that is transferred.

Heat pipes are currently used for a variety of applications including lasers, nuclear energy, dehumidification and air conditioning, thermal control in spacecrafts, cooling of electronics systems and cryogenics. Heat pipes can be designed to operate over a broad range of temperatures from cryogenic applications (<−243° C.) to high temperature applications (>2000° C.). The material for the heat pipe container, wick structure and working fluid are selected based on the application for which the heat pipe will be used.

Heat pipes are generally designed to perform within a particular operating temperature range, which is dependent on the application. When operating within this range, a heat pipe will provide highly reliable heat transfer for years. However, operation outside of this range causes degradation or even failure. Such a limitation is a disadvantage in applications where there may be peak loads which can cause a sudden temperature rise outside of the operating range of the heat pipe. Not only can this cause failure of the heat pipe, but also may cause damage to the system which is being cooled.

Temperature control devices using phase change materials (PCMs) have been employed in a variety of temperature stabilization applications including automotive, electronics and clothing applications. Often, PCMs, e.g., wax, are encapsulated in a durable, thermally conductive shell. PCMs provide a temperature load-leveling capability via the latent heat effect. PCMs store or release heat as they change phase between a liquid and solid state or, in the case of solid—solid PCMs, as they undergo reversible crystal structure transitions. The relatively high thermal capacity of PCMs make them advantageous for temperature control in high heat generating systems and for systems prone to transient peak loads. Electronics systems are one such system where PCMs may be particularly advantageous.

The increasing miniaturization of electronic components has made heat transfer a critical design concern as these systems create very high heat fluxes. In order for electronic devices to perform correctly and reliably, suitable operating temperatures must be maintained and temperature variations must be minimized. Due to the increasingly high heat generated from these systems, and their proneness for transient peak loads, common heat transfer technologies such as heat sinks, cold plates, direct impingement cooling systems and conventional heat pipes are approaching their heat transfer limits.

The use of PCMs in heat transfer devices is known in the art. For example, in U.S. Pat. No. 5,224,356 to Colvin et al., a method is disclosed whereby a plurality of microcapsules in the form of a powder are placed in contact with an object to be cooled. The microcapsules have a shell and contain an enhanced thermal energy absorbing material. The absorbing material may be a phase change material.

U.S. Pat. No. 5,007,478 to Sengupta, discloses a heat sink device adjacent to an article to be thermally controlled. The heat sink defines a chamber which contains a slurry of micro-encapsulated PCMs.

U.S. Pat. No. 5,831,831 to Freeland, discloses a bonding material/phase change material system for electronic device heat burst dissipation. The system comprises a phase change material disposed on a substrate and encircled by a bonding material. An electronic device having a heatspreader portion is positioned atop the phase change material and bonding material.

U.S. Pat. No. 5,555,932 to Dudley, discloses a heat shield for an automotive vehicle. The heat shield utilizes a phase change material to absorb excess heat generated by a heat source within the vehicle. The heat shield insulates a component adjacent to the heat source and prevents the transmission of heat to the component.

U.S. Pat. No. 4,911,232 to Colvin et al., discloses a method of obtaining enhanced heat transfer in a closed loop thermodynamic system. The system includes a two-component heat transfer fluid comprising a carrier fluid and a plurality of discrete reversible latent energy transition material particles. The fluid slurry is circulated about the loop and the loop is tuned so that a minimum temperature differential exists between the thermal source and sink in order to maximize the latent heat transport by adjustment of the heat transfer fluid flow rate, the rate of thermal energy input into the heat transfer fluid and the rate of cooling of heat transfer fluid. This method has the disadvantage of needing an outside energy source to pump the heat transferring slurry.

The above disclosures all relate to thermal regulating systems wherein the PCMs are contained within a structure which is substantially completely adjacent to the heat source. Thus, the PCMs release the absorbed heat, as well as absorb the heat, at a location proximate the heat source. They lack the advantage of having the heat released at a location distant from the heat source.

SUMMARY OF THE INVENTION

The present invention provides a wick for use in a heat pipe comprising particles comprising micro-encapsulated phase change materials (PCMs). The particles are bonded together to form a wick structure for the heat pipe. The micro-encapsulated PCM particles may be of uniform or varying sizes and may be bonded together using different techniques including sintering or gluing.

The present invention also provides a heat transfer device comprising a heat pipe which includes an envelope, a working fluid and a wick formed from micro-encapsulated PCM particles. The heat transfer device may also include a heat sink. The heat sink may have micro-encapsulated PCM particles attached to an outside surface of the heat sink or, alternatively, have micro-encapsulated PCM particles contained within the heat sink.

According to another aspect of the invention, the heat transfer device may include a first heat pipe and a second heat pipe having an envelope, a working fluid and a wick formed from or comprising micro-encapsulated PCM particles. The first heat pipe may be a conventional heat pipe or may have a wick comprised of micro-encapsulated PCM particles. The heat transfer device may further include a heat sink.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
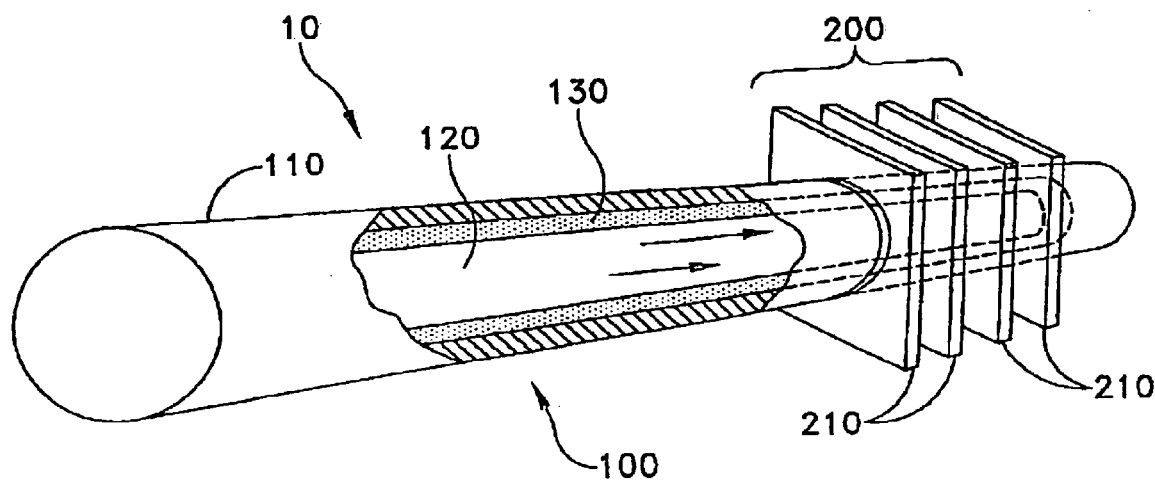
FIG. 1 is a perspective view, partially in cross-section, of a heat pipe formed according to the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 2:
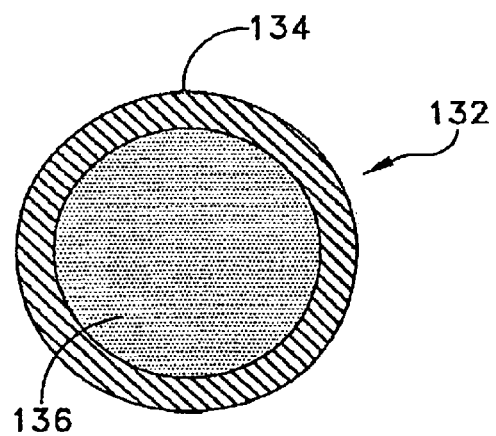
FIG. 2 is a transverse cross-sectional view of a micro-encapsulated phase change material particle.

Referring to FIGS. 1 and 2, a heat transfer device 10 formed in accordance with one embodiment of the present invention comprises a heat pipe 100 and a heat sink 200 mounted to a portion of heat pipe 100. Heat pipe 100 comprises an envelope 110, a working fluid 120 and a wick 130. Advantageously, wick structure 130 is formed from micro-encapsulated PCM particles 132 secured within envelope 110. Envelope 110 is vacuum tight and may be formed from a sealed tube of thermally conductive material, e.g., aluminum, copper, titanium alloy, tungsten, etc. Although shown as tubular, envelope 110 may be flat or take any other shape as required for a specific application. Additionally, heat pipe envelope 110 and wick 130 may be preformed, as needed.

Working fluid 120 may be selected from a variety of well known two phase fluids depending upon the application, and the operating temperature range to be covered by the heat transfer device. Such fluids may include, for example, water, freon, ammonia, acetone, methanol, or ethanol. The prime requirements for a suitable working fluid are compatibility with the materials forming wick 130 and envelope wall 110, good thermal stability, wettability of wick 130 and wall materials, an operating vapor pressure that is not too high or low over the operating temperature range, high latent heat, high thermal conductivity, low liquid and vapor viscosities, high surface tension and acceptable freezing or pour point. Preferably, the quantity of working fluid 120 in heat transfer device 10 should be just enough to saturate wick 130.

In one embodiment, wick 130 comprises a plurality of micro-encapsulated PCM particles 132 (FIGS. 2 and 3–6). Micro-encapsulated PCM particles 132 have an outer shell wall 134 surrounding a phase change material 136. Shell 134 may be formed from materials that are suitable for heat transfer applications of the type known to those in the art, e.g., metals such as, silver, gold, copper, aluminum, titanium or their alloys. Polymeric materials useful in this invention include any material useful in the electronics industry for heat transfer applications, including, without limitation, thermoplastics (crystalline or non-crystalline, cross-linked or non-cross-linked), thermosetting resins, elastomers or blends or composites thereof.

Illustrative examples of useful thermoplastic polymers include, without limitation, polyolefins, such as polyethylene or polypropylene, copolymers (including terpolymers, etc.) of olefins such as ethylene and propylene, with each other and with other monomers such as vinyl esters, acids or esters of unsaturated organic acids or mixtures thereof, halogenated vinyl or vinylidene polymers such as polyvinyl chloride, polyvinylidene chloride, polyvinyl fluoride, polyvinylidene fluoride and copolymers of these monomers with each other or with other unsaturated monomers, polyesters, such as poly(hexamethylene adipate or sebacate), poly(ethylene terephthalate) and poly(tetramethylene terephthalate), polyamides such as Nylon-6, Nylon-6,6, Nylon-6,10, Versamids, polystyrene, polyacrylonitrile, thermoplastic silicone resins, thermoplastic polyethers, thermoplastic modified cellulose, polysulphones and the like.

Examples of some useful elastomeric resins include, without limitation, rubbers, elastomeric gums and thermoplastic elastomers. The term "elastomeric gum", refers to polymers which are noncrystalline and which exhibit after cross-linking rubbery or elastomeric characteristics. The term "thermoplastic elastomer" refers to materials which exhibit, in various temperature ranges, at least some elastomer properties. Such materials generally contain thermoplastic and elastomeric moieties. For purposes of this invention, the elastomer resin can be cross-linked or non cross-linked when used in the inventive compositions.

Illustrative examples of some suitable elastomeric gums for use in this invention include, without limitation, polyisoprene (both natural and synthetic), ethylene-propylene random copolymers, poly(isobutylene), styrene-butadiene random copolymer rubbers, styrene-acrylonitrile-butadiene terpolymer rubbers with and without added copolymerized amounts of unsaturated carboxylic acids, polyacrylate rubbers, polyurethane gums, random copolymers of vinylidene fluoride and, for example, hexafluoropropylene, polychloroprene, chlorinated polyethylene, chlorosulphonated polyethylene, polyethers, plasticized poly(vinyl chloride), substantially non-crystalline random co- or terpolymers of ethylene with vinyl esters or acids and esters of unsaturated acids, silicone gums and base polymers, for example, poly(dimethyl siloxane), poly(methylphenyl siloxane) and poly(dimethyl vinyl siloxanes).

Some illustrative examples of thermoplastic elastomers suitable for use in the invention include, without limitation, graft and block copolymers, such as random copolymers of ethylene and propylene grafted with polyethylene or polypropylene side chains, and block copolymers of -olefins such as polyethylene or polypropylene with ethylene/propylene or ethylene/propylene/diene rubbers, polystyrene with polybutadiene, polystyrene with polyisoprene, polystyrene with ethylene-propylene rubber, poly (vinylcyclohexane) with ethylene-propylene rubber, poly(-methylstyrene) with polysiloxanes, polycarbonates with polysiloxanes, poly(tetramethylene terephthalate) with poly (tetramethylene oxide) and thermoplastic polyurethane rubbers.

Examples of some thermosetting resins useful herein include, without limitation, epoxy resins, such as resins made from epichlorohydrin and bisphenol A or epichlorohydrin and aliphatic polyols, such as glycerol, and which can be conventionally cured using amine or amide curing agents. Other examples include phenolic resins obtained by condensing a phenol with an aldehyde, e.g., phenol-formaldehyde resin. Other additives can also be present in the composition, including for example fillers, pigments, antioxidants, fire retardants, cross-linking agents, adjuvants and the like.

Shell 134 will possess a melting point that is substantially higher than the melting point of PCM 136, and higher than the expected temperature of the heat generating source. Thus, selection of the shell material will be dependent upon the application. Shell 134 should also be resilient so as to withstand cyclic expansions and contractions of PCM 136. The thickness of shell 134 may vary depending upon the material used.

PCM 136 may comprise a variety of materials depending on the application and the operating temperature range. Suitable materials include, without limitation, organic waxes and paraffins, inorganic multi-phase metal alloys, eutectic salts, and other materials known in the art. Selection and quantity of PCM 136 will depend upon the desired PCM melting point and how much heat will need to be absorbed. PCM 136 may also be a blend of different compounds to obtain the desired phase transition temperature or range. Also, different types of PCMs may be used in a single wick structure to increase the temperature range over which the heat pipe will be effective.

In addition to the liquid-solid PCMs listed, solid—solid PCMs, such as, polymer crystals, may also be used in connection with the present invention. Solid—solid PCMs undergo reversible solid-state crystal structure transitions at temperatures ranging from ambient up to about 100° C. Various of the polumer materials identified herein above are suitable for this application. Transition temperatures can be selected by forming solid solutions of different organic compounds. In one embodiment of the invention, a solid—solid PCM is employed without the use of shell 134. Transition of these solid—solid PCMs can occur over a fairly limited temperature range.

PCMs 136 can be encapsulated by any means known to those in the art. Such methods include coacervation, interfacial polymerization, air suspension and centrifugal extrusion. The size of particles 132 may be fairly uniform or, may be variable as desired. Preferably, the size ranges for particles 132 vary from about one micron to about one mm. The size of particles 132 will dictate the size of pores 138 between the particles (See FIG. 3). Pore size often determines the maximum capilliary pumping pressure of the wick and also effects wick permeability. Thus, a wick comprising particles having different sizes can be utilized depending upon the application of the heat pipe and its required orientation. PCM particles 132 are very often spherical in shape, but also may be cylindrically shaped, or may be elongated particles, cubes, monofilaments or fibers.

Figure 3:
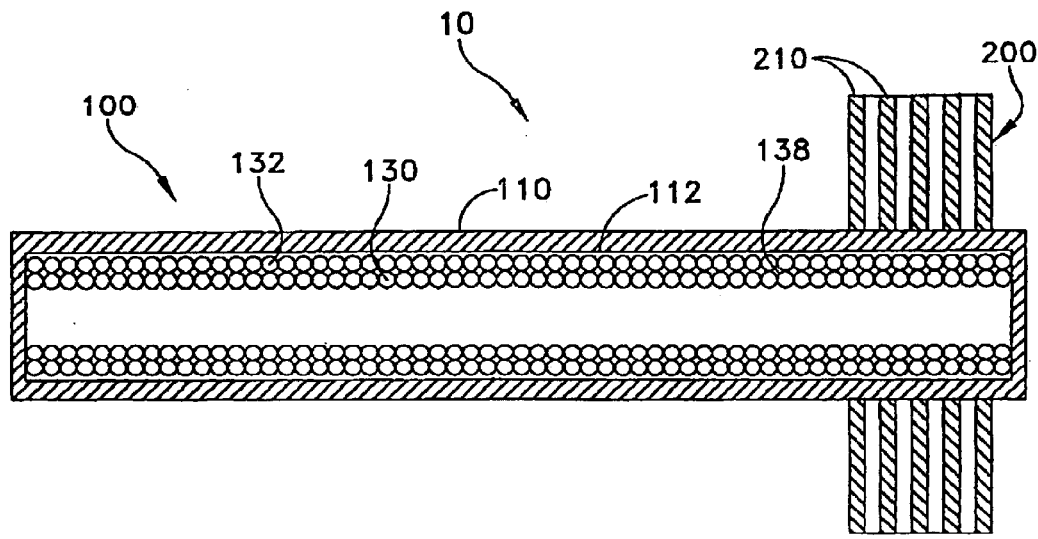
FIG. 3 is a longitudinal cross-sectional view of a heat pipe and heat sink formed according to one embodiment of the present invention.

Referring to FIG. 3, micro-encapsulated PCM particles 132 are bonded together to form a wick structure 130. The method by which micro-encapsulated PCM particles 132 are bonded will depend on the composition of shell 134. Where shells 134 comprise a metal, the particles are preferably sintered together. Where shells 134 comprise a polymer material, the particles are preferably adhered together by means of an adhesive or binder. Other methods known to those skilled in the art may also be employed.

Wick 130 formed from a plurality of micro-encapsulated PCM particles 132 functions in much the same way as a conventional heat pipe wick structure, i.e., capillary pressure is employed to pump working fluid from a condenser portion of the heat pipe to an evaporator portion. However, use of a wick structure comprising micro-encapsulated PCM particles has the added advantage of using the wick structure as an additional heat absorber and repository. This feature greatly enhances the ability of the heat pipe to absorb excess heat and may help to prevent damage to the heat pipe or heat generating component, such as an electronic device, especially at times of peak loads. Also, micro-encapsulated PCM particles may be incorporated into a conventional screen mesh type wick structure. In addition, PCM particles may also be bonded to a pre-sintered metal powder wick structure.

Heat transfer device 10 also may include a heat sink 200 that is mounted to a portion of envelope 110 of heat pipe 100 for further dissipating the absorbed thermal energy. Heat sink 200 may be in the form of folded of stamped fins 210, as shown in FIG. 3, or may take any other shape or form known to those skilled in the art.

Wick 130 may be formed separately from envelope 120, and then placed in the envelope 110 where it lines an inner surface 112 of envelope 110 just as with a conventional wick. Alternatively, PCM particles 132 may be formed into a wick in situ. Envelope 110 is then evacuated and backfilled with a small quantity of working fluid 120, preferably just enough to wet the wick 130. Heat pipe 100 is then hermetically sealed. Fins 210 may be attached to heat pipe 100 to act as a heat sink 200 for further dissipation of heat.

Figure 4:
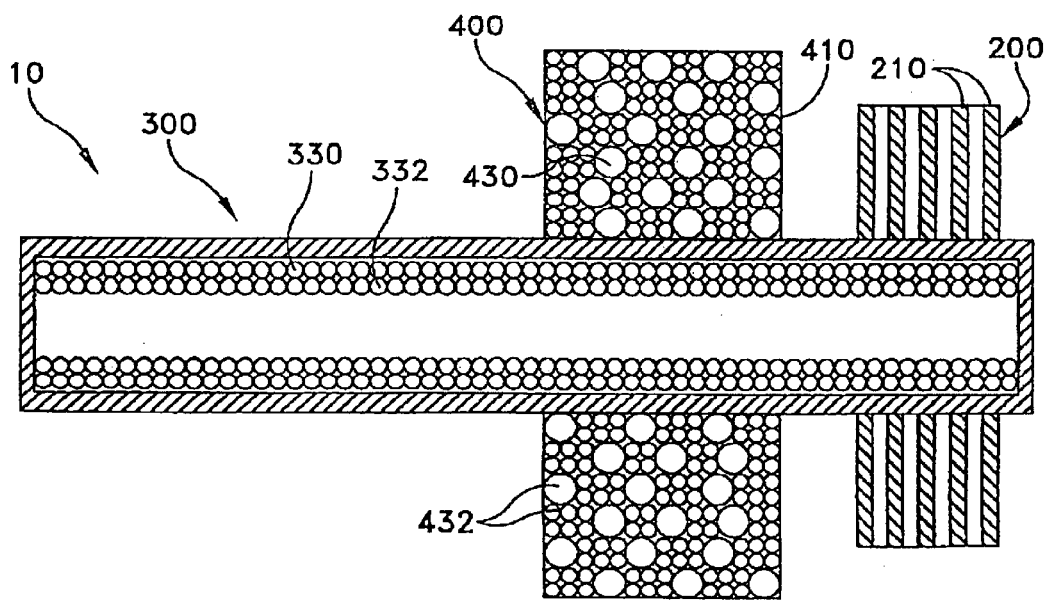
FIG. 4 is a longitudinal cross-sectional view of a first heat pipe and secondary heat pipe formed according to one embodiment of the present invention.

Referring to FIG. 4, another embodiment of heat transfer device 10 comprises a first heat pipe 300, a second heat pipe 400 and a heat sink 200. First heat pipe 300 may be a conventional heat pipe, i.e., containing a wick structure previously known and used in the art such as sintered powdered metal, screen meshes, grooved tube, or cable/fibers. Alternatively, first heat pipe 300 may be a heat pipe as described above, containing a wick 330 comprising micro-encapsulated PCM particles 332.

Second heat pipe 400 comprises an envelope 410, a working fluid (not shown) and a wick 430 comprising micro-encapsulated PCM particles 432, wherein wick structure 430 preferably essentially fills the entire volume of heat pipe 400. Preferably, wick structure 430 is made from small and large encapsulated PCM particles 432 (as shown in FIG. 4) so as to have small and large pore sizes in between the individual particles 432. The pores may range from $10^{-3}$ mm to 2 mm more or less. The large pores facilitate transport of the vapor, while the small pores provide capillary action for the heat pipe working fluid. Preferably, the working fluid will not entirely fill up the voids between the micro-encapsulated PCM particles 432. A heat sink 200 may also be attached to first heat pipe 300, such as fins 210 as shown in FIG. 4.

Figure 5:
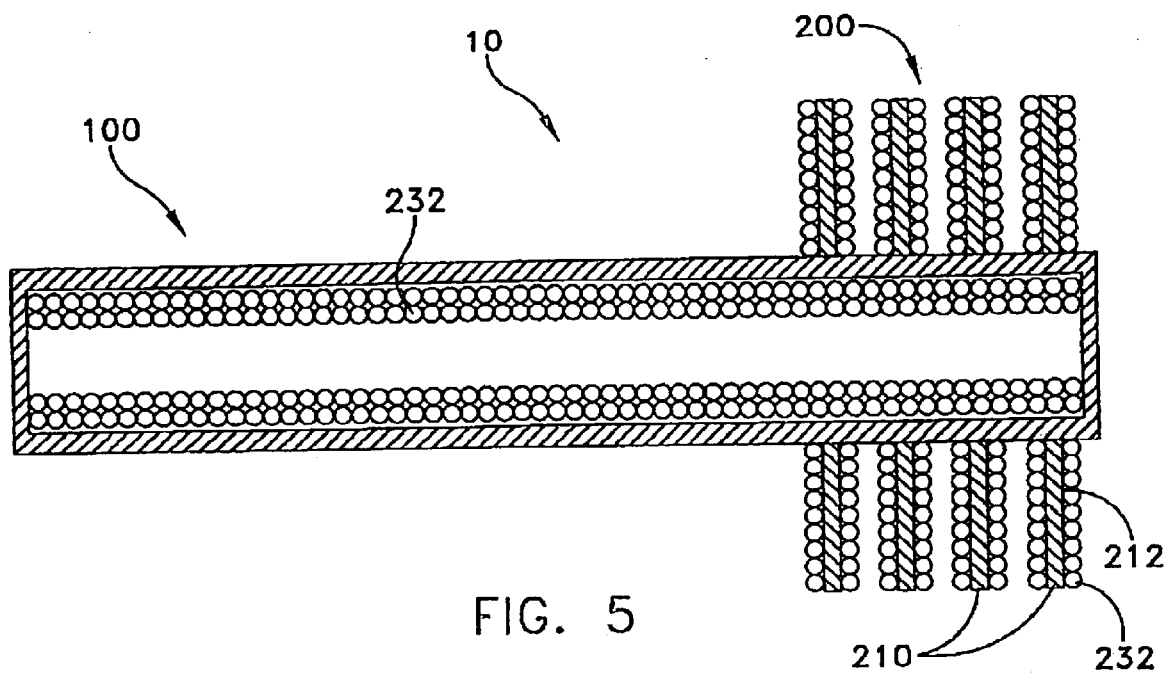
FIG. 5 is a longitudinal cross-sectional view of a heat pipe and heat sink formed according to one embodiment of the present invention.
Figure 6:
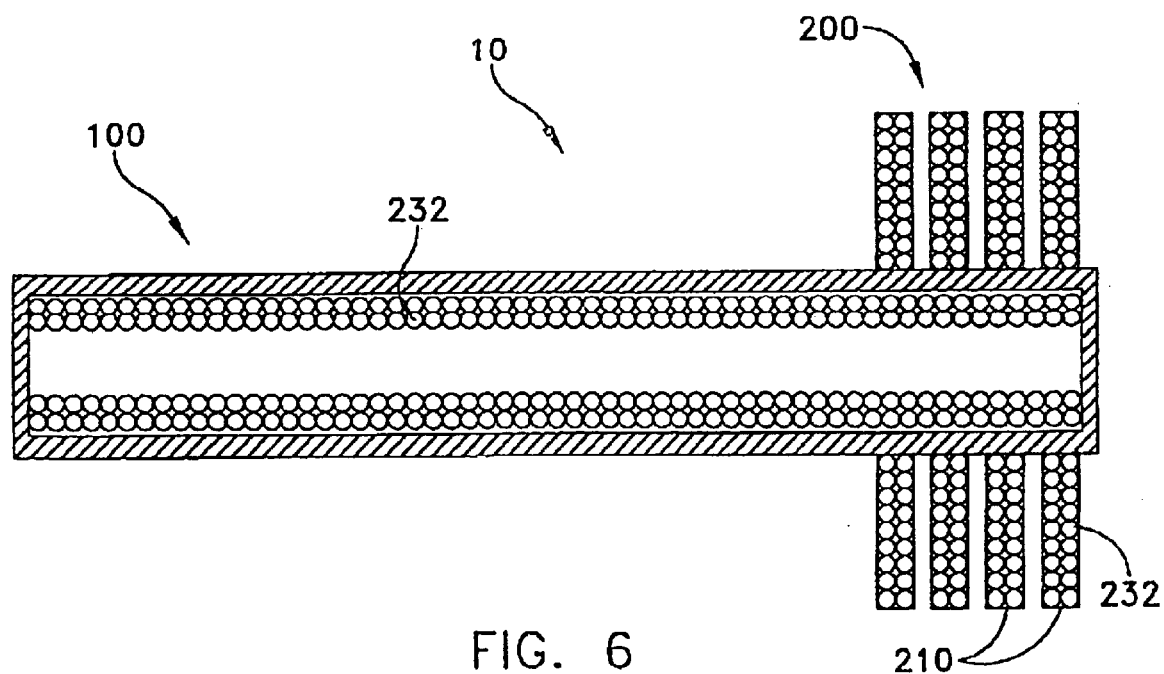
FIG. 6 is a longitudinal cross-sectional view of a heat pipe and heat sink formed according to one embodiment of the present invention.

Referring to FIG. 5, another embodiment of heat transfer device 10 comprises a heat pipe 100 and a heat sink 200. Heat pipe 100 may be a conventional heat pipe containing a traditional wick, or may have a wick structure comprising micro-encapsulated PCM particles 232 as described above, and as shown in FIG. 5. Heat sink 200 (shown as fins 210 in FIG. 5) includes micro-encapsulated PCM particles 232 attached to the outside surface 212 of heat sink 200. PCM particles 232 enhance the heat absorption capacity of the heat sink. In an alternative embodiment (FIG. 6) heat sink, 200 comprises a hollow material and contains micro-encapsulated PCM particles 232 within it.

It is to be understood that the present invention is by no means limited only to the particular constructions herein disclosed and shown in the drawings, but also comprises any modifications or equivalents within the scope of the claims.

What is claimed is:

1. A heat transfer device comprising:

a first heat pipe comprising an envelope, a wick and a working fluid;

a second heat pipe comprising an envelope, a wick and a working fluid, wherein said wick of said first heat pipe comprises particles of micro-encapsulated phase change material which are bonded together;

wherein said wick of said second heat pipe comprises particles of micro-encapsulated phase change material bonded together and defining pores between said particles; and wherein the second heat pipe is in thermal communication with said first heat pipe.

2. The heat transfer device of claim 1 wherein said particles of micro-encapsulated phase change material substantially fill an entire volume of said envelope.

3. The heat transfer device of claim 2 wherein said working fluid of said second heat pipe partially fills said pores formed between said micro-encapsulated phase change material particles.

4. The heat transfer device of claim 1 wherein said particles of micro-encapsulated phase change material form pores of varying sizes.

* * * * *